(12) United States Patent
Shimizu

(10) Patent No.: US 8,030,198 B2
(45) Date of Patent: Oct. 4, 2011

(54) SEMICONDUCTOR DEVICE AND MANUFACTURING METHOD THEREOF

(75) Inventor: Takashi Shimizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/349,823

(22) Filed: Jan. 7, 2009

(65) Prior Publication Data

US 2009/0174013 A1     Jul. 9, 2009

(30) Foreign Application Priority Data

Jan. 8, 2008   (JP) ................. 2008-001588

(51) Int. Cl.
*H01L 21/469* (2006.01)

(52) U.S. Cl. ........ 438/591; 438/585; 438/775; 438/786; 257/411; 257/E21.409

(58) Field of Classification Search ............ 438/585, 438/587, 591, 762, 770, 775, 786; 257/411, 257/E29.255, E21.409
See application file for complete search history.

(56) References Cited

U.S. PATENT DOCUMENTS

| | | | |
|---|---|---|---|
| 6,853,037 B2 * | 2/2005 | Kudo et al. ............ | 257/369 |
| 6,933,248 B2 | 8/2005 | Grider | |
| 7,238,997 B2 | 7/2007 | Matsushita et al. | |
| 2005/0020018 A1 * | 1/2005 | Ishikawa et al. ........ | 438/287 |
| 2007/0090493 A1 * | 4/2007 | Dong et al. ............ | 257/632 |
| 2008/0203500 A1 * | 8/2008 | Ogura et al. ............ | 257/411 |

FOREIGN PATENT DOCUMENTS

| | | | |
|---|---|---|---|
| JP | 2000-049159 | | 2/2000 |
| JP | 2000/357688 | * | 12/2000 |
| JP | 2004-023008 | | 1/2004 |
| JP | 2004-289082 | | 10/2004 |

* cited by examiner

*Primary Examiner* — Matthew Landau
*Assistant Examiner* — Colleen E Snow
(74) *Attorney, Agent, or Firm* — Finnegan, Henderson, Farabow, Garrett & Dunner, L.L.P.

(57) ABSTRACT

A semiconductor device includes a silicon substrate, an SiO film, and a High-K film. The SiO film is first formed on the silicon substrate and then subjected to a nitridation process to obtain an SiON film from the SiO film. The nitridation process is performed such that nitrogen concentration in the SiO film decreases from an interface with the silicon substrate below and an interface with the High-K film above, and nitrogen having predetermined concentration or more is introduced in a thickness within a range of 0.2 nm to 1 nm from the interface with the silicon substrate. The SiON film is etched up to a depth to which nitrogen of the predetermined concentration or more is introduced. The High-K film is then formed on the SiON film.

20 Claims, 10 Drawing Sheets

NITRIDATION USING NO GAS

PLASMA NITRIDATION

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2008-1588, filed on Jan. 8, 2008; the entire contents of which are incorporated herein by reference.

BACKGROUND OF THE INVENTION

1. Field of the Invention

The present invention relates to a semiconductor device and a manufacturing method of a semiconductor device.

2. Description of the Related Art

Recently, along with downsizing and lowering of operation voltage of field-effect transistors, thinning of gate dielectric films has been desired. Generally, a silicon oxide ($SiO_2$) film is used for a gate dielectric film in field-effect transistors. However, if the $SiO_2$ film is made thinner than 3 nanometers (nm), a leak current due to a tunnel current increases, and it leads to increase in the power consumption. To suppress the increase in the leak current due to the tunnel current, a high dielectric-constant material film (hereinafter, "High-K film"), such as an $HfO_2$ film, capable of achieving a thin $SiO_2$ film having a capacitance-conversion film thickness, although having a large physical film thickness, has come to be used. In this case, an $SiO_2$ film and a silicon oxide-nitride film (an SiON film) are used for an interface layer between the High-K film and a silicon (Si) substrate (for example, see JP-A 2004-289082 (KOKAI)). From the viewpoint of thinning of an entire gate dielectric film, it is preferable that the thickness of the interface layer be as small as possible. However, with the conventional method, as explained in detail below, forming an interface layer having a thickness equal to or smaller than 1 nm was difficult because of reoxidation and nitrogen introduction. For example, in a typical semiconductor-device manufacturing process, cleaning is performed immediately before forming a gate dielectric film. In a liquid solution process used in the cleaning process, however, a chemical oxide film ($SiO_2$) of about 1 nanometer is already formed.

Even when an interface layer including an $SiO_2$ film having a thickness equal to or smaller than 1 nm is first formed by heat oxidation, in a subsequent process of forming the High-K film or in a later process, a silicon substrate interface is reoxidized by active oxygen generated in the High-K film or by active oxygen entered from the outside. As a result, the film thickness of the interface layer increases. To suppress a rate of reoxidation, a method can be considered that uses an SiON film, which is a film that incorporates nitrogen into an $SiO_2$ film, as an interface layer to be formed first. However, a film thickness of the interface layer (the SiON film) also increases in a nitridation process of introducing nitrogen into the interface layer, and the film thickness of the interface finally increases to 1 nm or more. Particularly, when nitrogen concentration in the interface layer at the interface with the silicon substrate is attempted to be increased to suppress the rate of reoxidation, the increase in the film thickness at the time of introducing nitrogen becomes large. Which means that, with the conventional method, it was difficult to suppress the thickness of the interface layer to 1 nm or smaller while suppressing the reoxidation of the interface layer.

Furthermore, when a plasma nitridation process is used to nitrogenize the $SiO_2$ film in the interface layer, it is difficult to efficiently incorporate nitrogen into the interface layer at the silicon substrate side generating the reoxidation, because the plasma nitridation process is a surface reaction process (for example, see JP-A 2004-23008 (KOKAI)).

SUMMARY OF THE INVENTION

A method of manufacturing a semiconductor device including a gate electrode formed on a silicon substrate via a high-dielectric-constant material film having a higher dielectric constant than that of silicon oxide, and a source/drain region formed on a surface of the silicon substrate around the gate electrode, the method according to an embodiment of the present invention comprises; forming a silicon oxide film on the silicon substrate; nitrogenizing the silicon oxide film to form a silicon oxide-nitride film so that nitrogen having concentration equal to or higher than a predetermined concentration is introduced into the silicon oxide film within a range of a thickness from 0.2 nanometer to 1 nanometer from an interface with the silicon substrate, and so that nitrogen concentration in the silicon oxide film is lowered from the interface with the silicon substrate toward the high-dielectric-constant material film, within the range of thickness; etching the silicon oxide-nitride film to a thickness to which the nitrogen in the predetermined concentration or more is introduced thereby forming an interface layer including a silicon oxide-nitride film introduced with nitrogen in the predetermined concentration or higher; and forming the high-dielectric-constant material film on the interface layer.

A method of manufacturing a semiconductor device including on a silicon substrate a plurality of types of field-effect transistors having different capacitance film-thicknesses of a gate dielectric film, each field-effect transistor including the gate dielectric film and a gate electrode formed on the silicon substrate, and a source/drain region formed on a surface of the silicon substrate around the gate electrode, the method according to an embodiment of the present invention comprises: forming a silicon oxide film in a first region and a second region on the silicon substrate; nitrogenizing the silicon oxide film to form a silicon oxide-nitride film so that nitrogen having concentration equal to or higher than a predetermined concentration is introduced into the silicon oxide film within a range of a thickness from 0.2 nanometer to 1 nanometer from an interface with the silicon substrate, and so that nitrogen concentration in the silicon oxide film is lowered from the interface with the silicon substrate toward the high-dielectric-constant material film, within this range of thickness; etching the silicon oxide-nitride film to a thickness to which the nitrogen in the predetermined concentration or more is introduced thereby forming on the first region an interface layer including a silicon oxide-nitride film introduced with nitrogen in the predetermined concentration or higher; and forming a high-dielectric-constant material film having a higher dielectric constant than that of silicon oxide on at least the interface layer in the first region.

A semiconductor device according to an embodiment of the present invention comprises: a silicon substrate; an element-isolation dielectric film formed on a surface of the silicon substrate; a gate electrode formed on the silicon substrate surrounded by the element-isolation dielectric film via a high-dielectric-constant material film having a higher dielectric constant than that of silicon oxide; a source/drain region formed on the surface of the silicon substrate around the gate electrode; and an interface layer including silicon oxide-nitride film having a peak in a depth-direction distribution of nitrogen concentration near an interface with the silicon substrate, and having a thickness within 0.2 nanometer to 1 nanometer, between the silicon substrate and the high-dielectric-constant material film.

DETAILED DESCRIPTION OF THE PREFERRED EMBODIMENTS

Exemplary embodiments of a semiconductor device and a manufacturing method thereof according to the present invention will be explained below in detail with reference to the accompanying drawings. The present invention is not limited to the following embodiments. Further, the cross-sectional views are only schematic. In other words, the relationship between film thicknesses and widths and the ratio of each film thickness can be different in the actual products. In addition, film thicknesses in the embodiments are only exemplary. In other words, the film thicknesses mentioned in the following embodiments are not mandatory.

Figure 1:
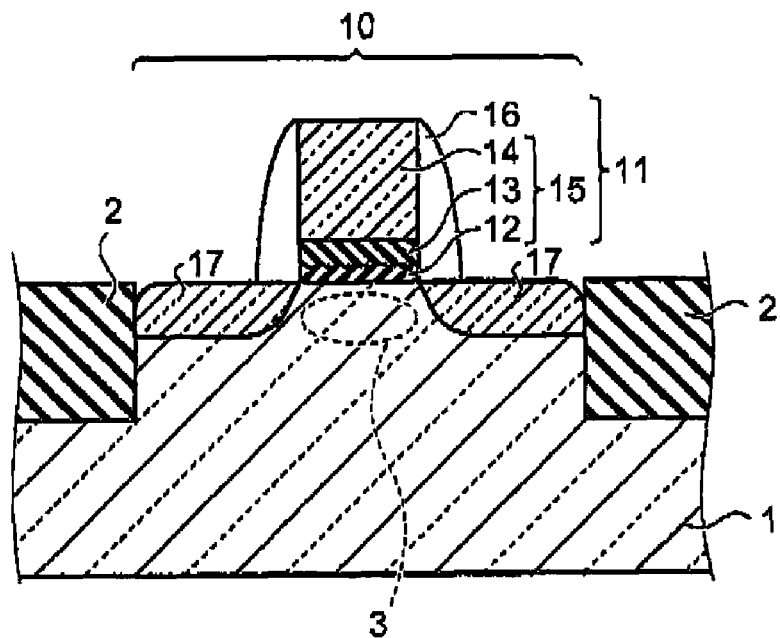
FIG. 1 is a cross-sectional view of a configuration of a semiconductor device according to a first embodiment of the present invention.

FIG. 1 is a cross-sectional view of an example of a configuration of a semiconductor device according to a first embodiment of the present invention. The semiconductor device includes a first-conductive silicon substrate (a silicon substrate) 1 as a semiconductor substrate. An element-isolation dielectric film 2 made of a silicon oxide ($SiO_2$) film and the like is formed on an upper surface of the first-conductive silicon substrate 1. A metal insulator semiconductor (MIS) field-effect transistor 10 having a metal/insulator/semiconductor junction is formed within an element formation region limited by the element-isolation dielectric film 2. The field-effect transistor 10 includes a gate structure 11, and source/drain regions 17 forming a pair around a channel region 3 below the gate structure 11. The gate structure 11 includes a gate stacked layer 15, and a gate sidewall film 16 formed by an insulation film such as a silicon nitride film on both side surfaces of the gate stacked layer 15 in a line width direction. The gate stacked layer 15 includes an interface layer 12 formed on the channel region 3; a High-K film 13 such as HfSiON having a higher dielectric constant than that of $SiO_2$; and a gate electrode 14 made of a conductive material such as a polysilicon film, TiN, Mo, Au, Al, Pt, Ag, and W. The interface layer 12 and the High-K film 13 function as gate dielectric films. FIG. 1 is an example that the gate electrode 14 is formed by a semiconductor (a polysilicon film).

The interface layer 12 is an SiON film having a thickness equal to or larger than 0.2 nm and equal to or smaller than 1 nm. It is desirable that the thickness of the interface layer 12 be equal to or larger than 0.2 nm; because, a nitrogen atom layer having a thickness equal to or larger than one atom layer is necessary to suppress diffusion of oxygen from the High-K film 13 to the silicon substrate 1. It is desirable that the thickness of the interface layer 12 be equal to or larger than 1 nm; because, when the film thickness is larger than 1 nm, the interface layer 12 having a film thickness larger than a target capacitance-conversion film thickness is generated.

Figure 2:
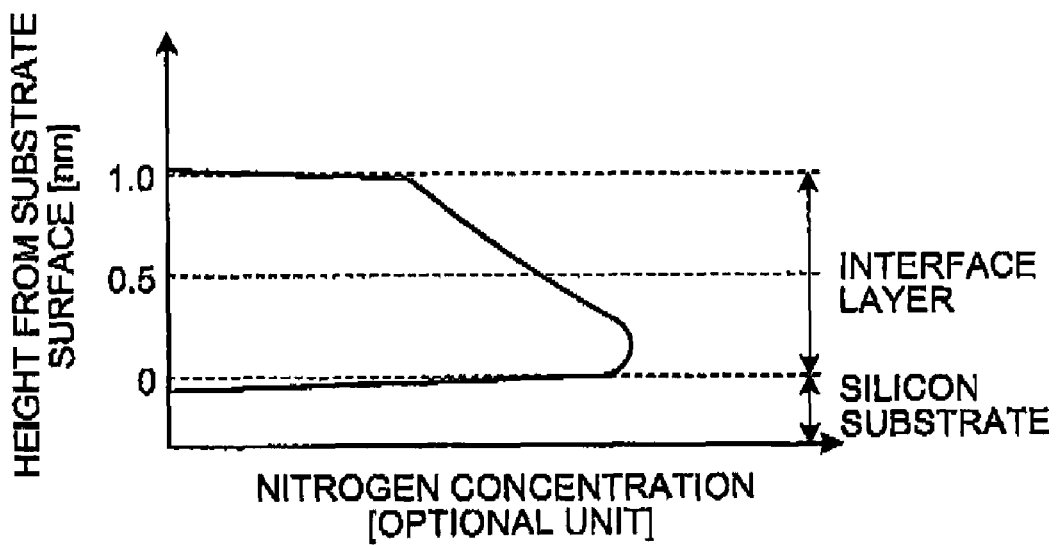
FIG. 2 is an example of a profile of a depth-direction distribution of nitrogen concentration in an interface layer.

FIG. 2 is an example of a profile of a depth-direction distribution of nitrogen concentration in the interface layer 12. As shown in FIG. 2, the interface layer 12 preferably has a peak of a depth-direction distribution of nitrogen concentration near the interface with the silicon substrate 1. Specifically, nitrogen concentration preferably has a peak of the depth-direction distribution at a depth equal to or smaller than 0.5 nm from the interface with the silicon substrate 1.

A definition in this specification of an interface between the interface layer 12 (the SiON film) and the silicon substrate 1 is explained next. As described above, in the first embodiment, at least one layer of nitrogen is present in the interface layer 12 near the interface with the silicon substrate 1. Regarding a layout of silicon and oxygen as constituent elements of the interface layer 12 (the SiON film), two situations are possible. One situation is that the silicon substrate 1 having a plurality of continuous layers of silicon atom is arranged beneath a layer of nitrogen atom. The other situation is that a layer of oxygen atom is present beneath a layer of nitrogen atom, and a plurality of layers of silicon atom are continuously present beneath the layer of oxygen atom. A boundary between a layer of silicon atom nearest a layer of nitrogen atom among layers formed by having a plurality of layers of silicon atom continuously formed from a layer of nitrogen atom in the interface layer 12 positioned nearest the silicon substrate 1 toward the silicon substrate 1, and the layer of the nitrogen atom or a layer of oxygen atom is called an interface between the interface layer 12 and the silicon substrate 1. When the interface is defined in this way, there is a high proportion that the interface between the interface layer 12 and the silicon substrate 1 is present within a range of about 0.2 nm from the layer of nitrogen atom in the interface layer 12 positioned nearest the silicon substrate 1. That is, a layer of nitrogen atom in the interface layer 12 is present within a range of about 0.2 nm from the interface with the silicon substrate 1.

As described later, in the first embodiment, nitrogen is introduced into the interface layer 12 at a portion near the interface with the silicon substrate 1 and not from an upper surface of the interface layer 12. Therefore, a peak in the depth-direction distribution of nitrogen concentration is present in the interface layer 12 near the interface with the silicon substrate 1 (ideally, at the interface between the interface layer 12 and the silicon substrate 1). As a result, in many cases, the peak of concentration is present in the interface layer 12 within about 0.5 nm from the interface with the silicon substrate 1 as defined above. For the above reason, the peak of a depth-direction distribution of nitrogen concentration in the interface layer 12 is preferably within 0.5 nm from the interface with the silicon substrate 1.

Physical film thicknesses of the interface layer 12 and the High-K film 13 are determined so as to produce a capacitance-conversion film thickness of a gate dielectric film required according to the size and the characteristics of the field-effect transistor 10 to be manufactured. The SiON film of the interface layer 12 has a higher dielectric constant than that of the $SiO_2$ film, and the dielectric constant varies depending on nitrogen concentration. Specifically, the dielectric constant is high when the nitrogen Concentration is high. That is, although the physical film thicknesses are the same, dielectric constants can be different depending on the nitrogen concentration. Therefore, the capacitance-conversion film thicknesses also change. Accordingly, a physical film thickness of the interface layer 12 changes according to the concentration of nitrogen that can be introduced into the interface layer 12. Generally, when nitrogen concentration in the interface layer 12 and a physical film thickness (range of 0.2 nm to 1 mm) are determined, a physical film thickness of the High-K film 13 to obtain a target capacitance-conversion film thickness of the entire gate dielectric film is determined.

Figure 3A:
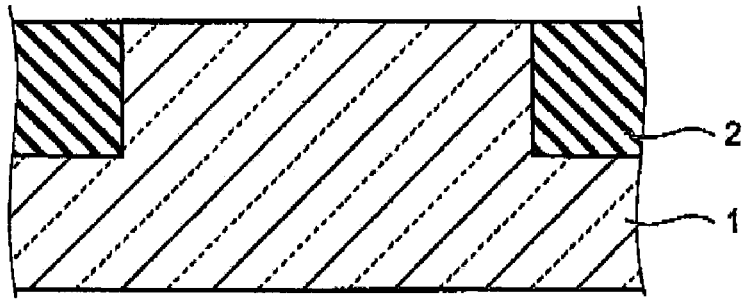
FIG. 3A to FIG. 3H are cross-sectional views for explaining an example of a procedure of manufacturing the semiconductor device according to the first embodiment.
Figure 3B:
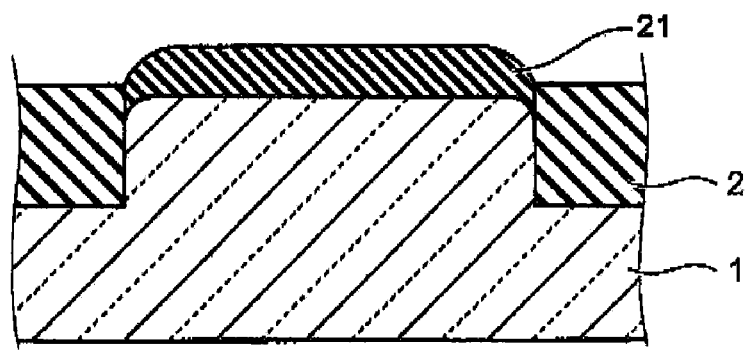

A method of manufacturing the semiconductor device is explained next. FIG. 3A to FIG. 3H are cross-sectional views for explaining an example of a procedure of manufacturing the semiconductor device according to the first embodiment. First, the element-isolation dielectric film 2 of a predetermined pattern is formed by the shallow trench isolation (STI) method or the like on the surface of the silicon substrate 1 having a first conductivity (FIG. 3A). Next, an $SiO_2$ film 21, i.e., a base of the interface layer 12, is formed by heat oxidation on the surface of the silicon substrate 1 in a region surrounded by the element isolation dielectric film 2, (FIG. 3B). A film thickness of the $SiO_2$ film 21 is 4 nm, for example.

Figure 3C:
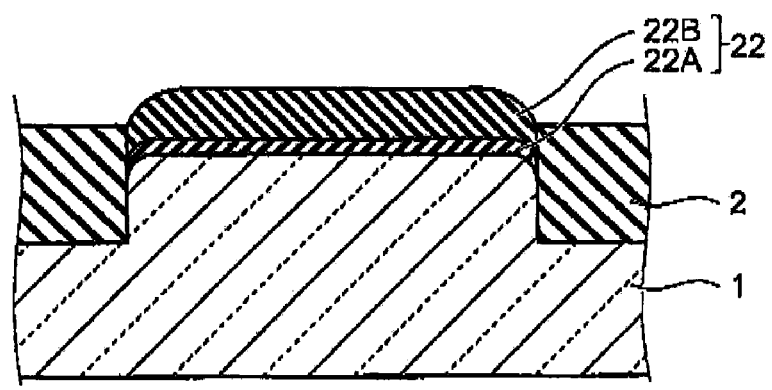

Thereafter, a thermal nitridation process is performed to have a peak of nitrogen concentration in the $SiO_2$ film 21 near the interface with the silicon substrate 1, thereby forming a silicon nitrogenized film (an SiON film) 22 from the $SiO_2$ film 21 (FIG. 3C). It is preferable that the nitrogen concentration is equal to or higher than about 10 at % in a region of the SiON film 22 at the silicon substrate 1 side, particularly in a range of 0.2 nm to 1 nm from the interface with the silicon substrate 1. In this example, nitrogen in the density of about 30 at % is introduced into the SiON film 22 near the interface with the silicon substrate 1, however, it is allowable that nitrogen in the density of about 20 at % is introduced into the SiON film 22 near the interface with the silicon substrate 1. In the following explanation, a region in the SiON film 22 in the range of 0.2 nm to 1 nm from the interface with the silicon substrate 1 has high nitrogen concentration, and this region is called an SiON composition region 22A. The remaining portion of the SiON film 22 has low nitrogen concentration and is close to $SiO_2$ composition, and therefore it is called an $SiO_2$ composition region 22B.

Figure 4A:
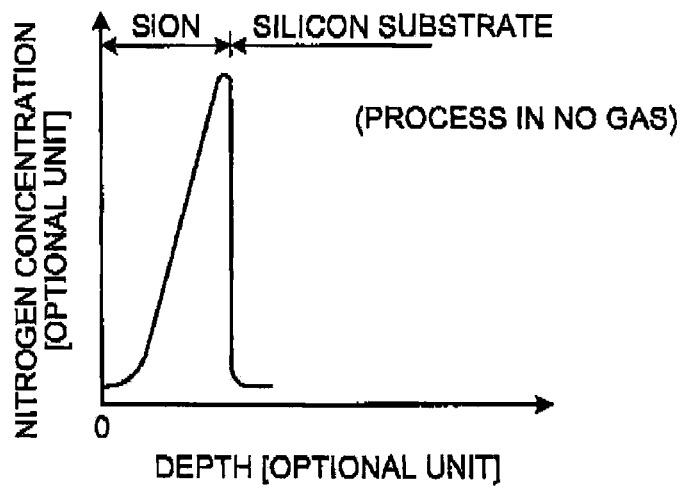
FIG. 4A to FIG. 4C are examples of profiles of a depth-direction distribution of nitrogen concentration in an SiON film after a thermal nitridation process.
Figure 4B:
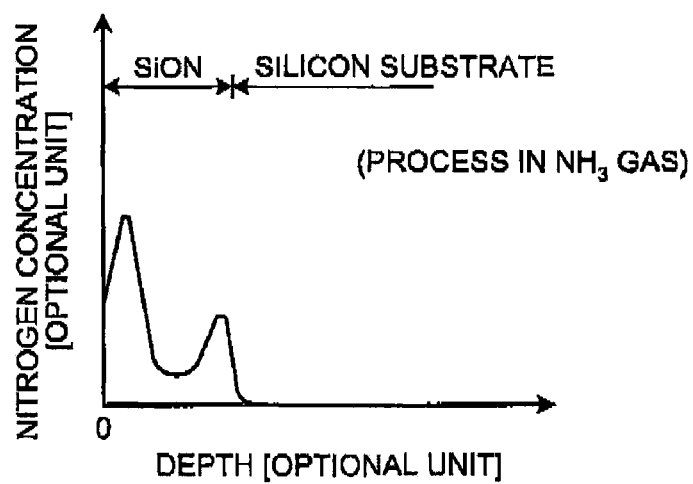
Figure 4C:
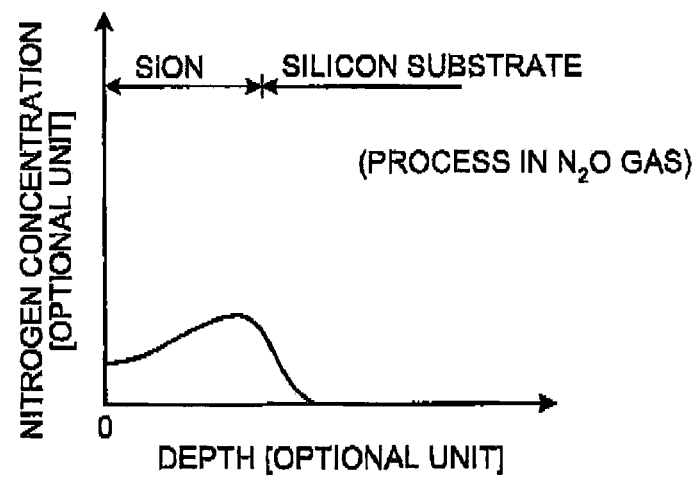

For the thermal nitridation process, heat processing at a temperature within 800° C. to 950° C. in NO gas atmosphere, $NH_3$ gas atmosphere, or $N_2O$ gas atmosphere can be exemplified. FIG. 4A to FIG. 4C schematically depict examples of profiles of a depth-direction distribution of nitrogen concentration in an SiON film after the thermal nitridation process. FIG. 4A is an example of a profile of a depth-direction distribution of nitrogen concentration in an $SiO_2$ film when the thermal nitridation process is performed in the NO gas atmosphere. As shown in FIG. 4A, the nitridation process using NO gas into the $SiO_2$ film is started from the interface with the silicon substrate. As a result, nitrogen concentration in the SiON film is known to have a profile that the nitrogen concentration has a peak near the interface with the silicon substrate, and that the concentration becomes low toward the upper surface of the SiON film (for example, see JP-A 2000-49159 (KOKAI)).

FIG. 4B is an example of a profile of a depth-direction distribution of nitrogen concentration in an SiON film when the thermal nitridation process is performed in the $NH_3$ gas atmosphere. As shown in FIG. 4B, the nitridation process using $NH_3$ gas is started into the upper surface of the $SiO_2$ film from the interface with the silicon substrate. As a result, nitrogen concentration in the SiON film is known to have a profile that the nitrogen concentration has two peaks on the upper surface of the SiON film and near the interface with the silicon substrate, and that the concentration becomes low near the center of the film thickness of the SiON film (for example, see JP-A 2000-49159 (KOKAI)). FIG. 4B depicts that a peak value of the nitrogen concentration on the upper surface of the SiON film is higher than a peak value of the nitrogen concentration near the interface with the silicon substrate, this is only one example. However, the peak value of the nitrogen concentration on the upper surface of the SiON film can be lower than or can be the same as the peak value of the nitrogen concentration near the interface with the silicon substrate.

FIG. 4C is an example of a profile of depth-direction distribution of nitrogen concentration in the SiON film when the thermal nitridation process is performed in the $N_2O$ gas atmosphere. In the nitridation process using $N_2O$ gas, concentration of nitrogen introduced into the $SiO_2$ film becomes lower than the concentration of nitrogen when the nitridation process is performed in the NO gas atmosphere or in the $NH_3$ gas atmosphere. As shown in FIG. 4C, nitrogen concentration in the SiON film is known to have a profile that the nitrogen concentration has a peak in the SiON film near the interface with the silicon substrate, and that the concentration becomes low toward the upper surface of the SiON film (for example, see JP-A 2000-49159 (KOKAI) and U.S. Pat. No. 6,933,248).

Among the above processes, the most preferable process is the thermal nitridation process in the NO gas atmosphere because it can form a profile having a peak of nitrogen concentration in the SiON film near the interface with the silicon substrate and introduce nitrogen in high concentration into the SiON film near the interface with the silicon substrate. When a profile of a depth-direction distribution of nitrogen concentration in the SiON film as shown in FIG. 4A can be obtained, the nitridation process can be performed by other method. A condition of the nitridation process is optimized based on concentration of nitrogen introduced into the SiON film 22 near the interface with the silicon substrate 1.

Figure 3D:
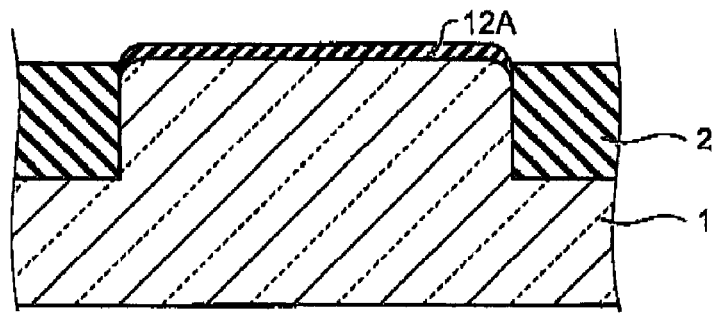

Next, an etching process is performed until the physical film thickness of the SiON film 22 becomes 0.2 n to 1 nm using etching liquid or etching gas capable of taking a large selection rate of an $SiO_2$ film relative to the silicon oxide-nitride film (FIG. 3D). For the etching liquid capable of taking a large selection rate of an $SiO_2$ film relative to the silicon oxide-nitride film, there can be exemplified ammonium fluoride solution and hydrogen fluoride solution. By this etching process, the $SiO_2$ composition region 22B in the SiON film 22 can be etched, the SiON composition region 22A can be left, and an interface layer 12A can be formed.

Figure 5:
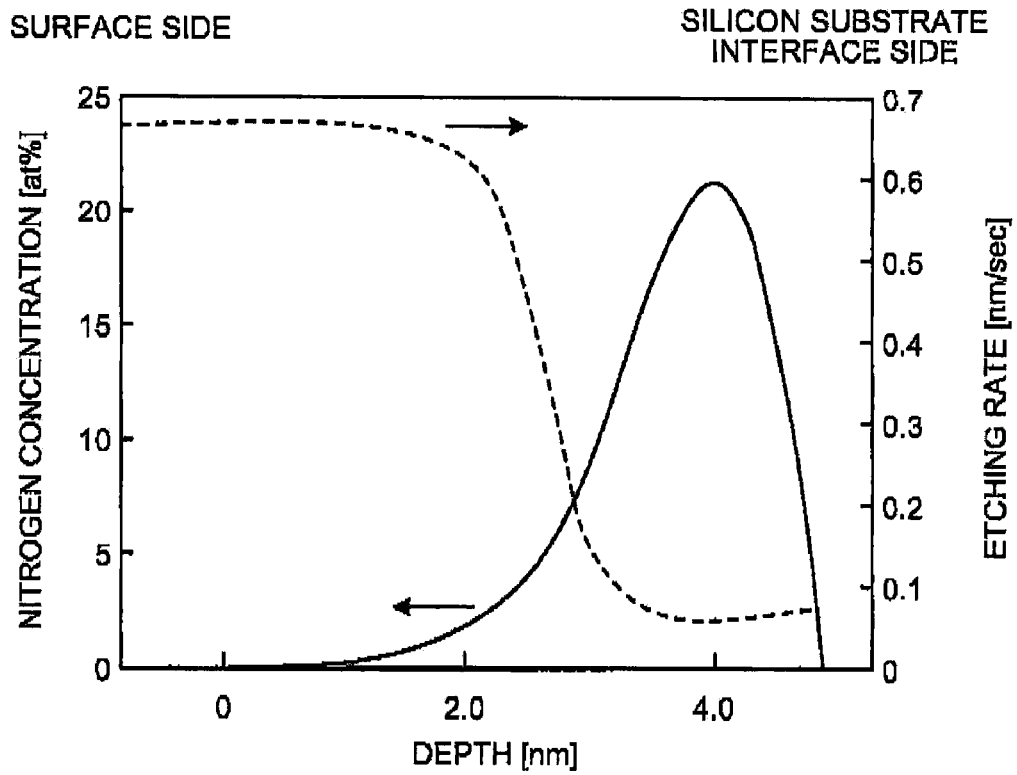
FIG. 5 a graph for explaining a relationship between etching rate and nitrogen concentration in the interface layer to which the thermal nitridation process is performed.

FIG. 5 depicts a relationship between etching rate and nitrogen concentration in the interface layer to which the thermal nitridation process is performed. Specifically, FIG. 5 depicts a relationship between nitrogen concentration in the SiON film manufactured in the NO gas atmosphere in each depth of the interface layer and an etching rate when the SiON film is wet etched in the ammonium fluoride solution. In FIG. 5, a horizontal axis represents a depth (nm) from the upper surface of the SiON film, and a vertical axis at the left side represents nitrogen concentration (at %) in the SiON film. A vertical axis at the right side represents an etching rate (nm/sec) of the SiON film. In FIG. 5, a solid line represents nitrogen concentration in the SiON film, and a broken line represents an etching rate. As shown in FIG. 5, the SiON film 22 manufactured in the NO gas atmosphere has a peak of nitrogen concentration in the SiON film 22 near the interface with the silicon substrate 1, and the nitrogen concentration becomes low toward the upper surface. Therefore, when the etching is performed using the ammonium fluoride solution, which is an example of the etching liquids capable of taking a large selection rate of the $SiO_2$ film relative to the silicon oxygen-nitride film, the etching rate is high in the $SiO_2$ composition region 22B near the $SiO_2$ composition in the thickness of about 3 nm from the upper surface of the SiON film 22. The etching rate becomes low in the SiON composition region near the SiON composition.

Figure 6:
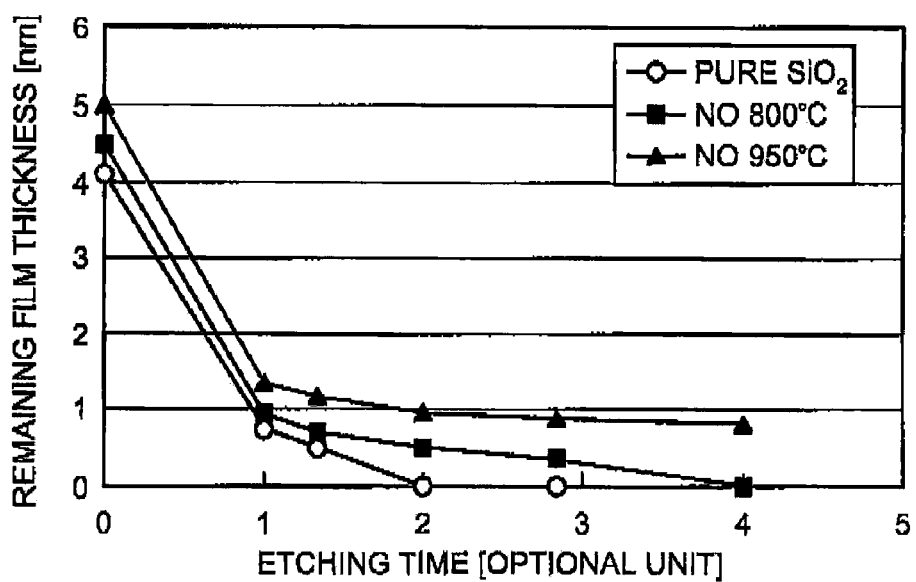
FIG. 6 depicts a state of etching the interface layer thermally nitrogenized in NO gas atmosphere.

FIG. 6 depicts a state of etching the interface layer thermally nitrogenized in the NO gas atmosphere. FIG. 6 depicts a change of a thickness due to lapse of time when the SiON film and the $SiO_2$ film are etched using the ammonium fluoride solution. A horizontal axis represents an etching time (an optional unit), and a vertical axis represents a film thickness 1 mm of the remaining interface layer 12. In FIG. 6, data indicated by black squares represents a result of etching an SiON film having a thickness of about 4.5 nm obtained by performing the thermal nitridation process at 800° C. in the NO gas atmosphere. Data indicated by black triangles represents a result of etching an SiON film having a thickness of about 5 nm obtained by performing the heat processing at 950° C. in the NO gas atmosphere. Data indicated by white circles represents a result of etching an $SiO_2$ film having a thickness of about 4 nm not introduced with nitrogen.

When the $SiO_2$ film is etched using the ammonium fluoride solution, a film thickness decreases along the increase in etching time, and all film is finally etched. On the other hand, when the SiON film is etched, the etching tends to be substantially suspended when a remaining film thickness reaches a certain value. For example, for the SiON film manufacture at 800° C. in the NO gas atmosphere, this film is not etched along a lapse of etching time when the remaining film thickness becomes about 1 nm, and the remaining film thickness gradually changes to 0 nm. For the SiON film manufacture at 950° C. in the NO gas atmosphere, the progress of the etching is substantially suspended when the remaining film thickness becomes about 1 nm. As explained with reference to FIG. 5, because nitrogen is introduced in high concentration into the SiON film 22 in the range of about 1 nm from the interface with the silicon substrate 1, the composition becomes SiON, and the etching rate using the etching liquid tends to become extremely lower than the etching rate of $SiO_2$. It can be considered from FIG. 5 and FIG. 6 that when the nitrogen concentration in the SiON film is equal to or higher than about 5 at %, the etching rate suddenly becomes low, and that when the nitrogen concentration in the SiON film is equal to or higher than about 10 at %, the etching rate becomes equal to or lower than 0.1 nm/sec and the SiON film is not substantially etched.

Further, nitrogen concentration in the SiON film manufactured at 950° C. in the NO gas atmosphere tends to be higher than nitrogen concentration in the SiON film manufactured at 800° C. in the NO gas atmosphere. That is, when a temperature at which the heat processing is performed is higher, more nitrogen is taken into the SiON film. Therefore, there arises a difference between film thicknesses at which the etching rate stops. That is, in the SiON film formed at 950° C. at which more nitrogen is introduced, nitrogen is dispersed to a position far from the interface with the silicon substrate 1. Therefore, the etching rate does not substantially increase in the SiON film at a position far from the interface with the silicon substrate 1. On the other hand, nitrogen concentration is relatively low in the SiON film manufactured at 800° C. Therefore, a position at which the etching rate does not substantially increase becomes nearer to the silicon substrate 1 than to the position when the SiON film is formed at 950° C. By using this characteristic, a thickness of the SiON film from the silicon substrate 1 including concentration equal to or higher than predetermined nitrogen concentration can be changed between 0.2 nm and 1 nm.

When the SiON film formed by changing its thickness within a range of 0.2 nm to 1 nm from the silicon substrate 1 containing predetermined nitrogen concentration or more is etched using an etching liquid of which etching rate changes based on nitrogen concentration, a self-limit function of automatically stopping the etching at a portion having the equal to or more than predetermined nitrogen concentration can be achieved. Accordingly, the interface layer 12A having a predetermined thickness within a range of 0.2 nm to 1 nm can be obtained. In this example, by performing the etching in a processing time obtained by extending by 30% the etching time required to completely etch an $SiO_2$ film having a thickness of 3 nm, the interface layer 12A of the SiON film having a physical film thickness 0.5 nm and nitrogen concentration 30 at % is obtained.

As explained above, the thermal nitridation condition can be optimized based on concentration of nitrogen introduced into the interface layer 12A at the interface with the silicon substrate 1. As a result, a thickness of the SiON composition region 22A having predetermined nitrogen concentration or more in the SiON film 22 is determined. Further, a remaining film thickness of the interface layer 12A is determined based on the self-limit function of the etching condition in the nitrogen concentration condition of the SiON film. A film-increase suppression effect obtained by reoxidation is determined by the remaining film thickness of the interface layer 12A and by a final amount of nitrogen in the interface layer 12A at the interface with the silicon substrate 1. Further, a final capacitance film thickness of a gate dielectric film (the interface layer 12A+a High-K film 13A) and an interface characteristic are determined.

Although the above explanation relates to a nitridation process using NO gas as shown in FIG. 4A, similar explanation holds true for a case where a profile of nitrogen concentration shown in FIG. 4B and FIG. 4C is obtained. However, as shown in FIG. 4B, when both the upper surface of the SiON film and the vicinity of the interface with the silicon substrate have peaks of nitrogen concentration, an etching rate drops on the upper surface of the SiON film. After passing the peak on the upper surface, the etching is substantially suspended at the peak near the interface with the silicon substrate using the self-limit function described above. With this arrangement, the interface layer 12A having a desired thickness within a range of 0.2 nanometer to 1 nanometer can be obtained. To obtain this interface layer 12A, following etching methods are available. That is, a method of controlling the etching by increasing the etching time using the above etching liquid or etching gas; and a method of performing the etching using an etching liquid or an etching gas increasing the etching rate of the silicon oxygen-nitride film in only a region of a thickness where the nitrogen concentration near the upper surface of the SiON film is equal to or higher than predetermined concentration, and performing the etching using an etching liquid or an etching gas capable of taking a larger selection rate of a silicon oxide film than that of the silicon oxide-nitride film in other regions.

Figure 3E:
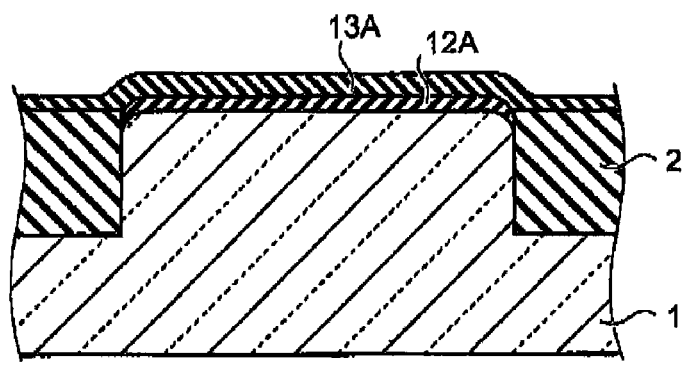

Thereafter, the High-K film 13A such as an HfSiON film having a predetermined film thickness is formed on the whole surface of the interface layer 12A made of the SiON film having a thickness within the range of 0.2 nm to 1 nm (FIG. 3E). A thickness of the High-K film 13A is determined according to the characteristics and the size of the field-effect transistor 10 to be manufactured as described above and according to nitrogen concentration and a thickness of the SiON film constituting the interface layer 12A. In this example, the High-K film 13A is deposited by about 3 nm.

Figure 3F:
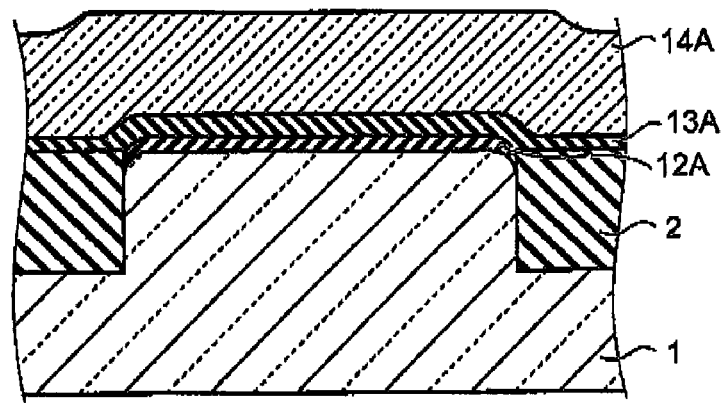
Figure 3G:
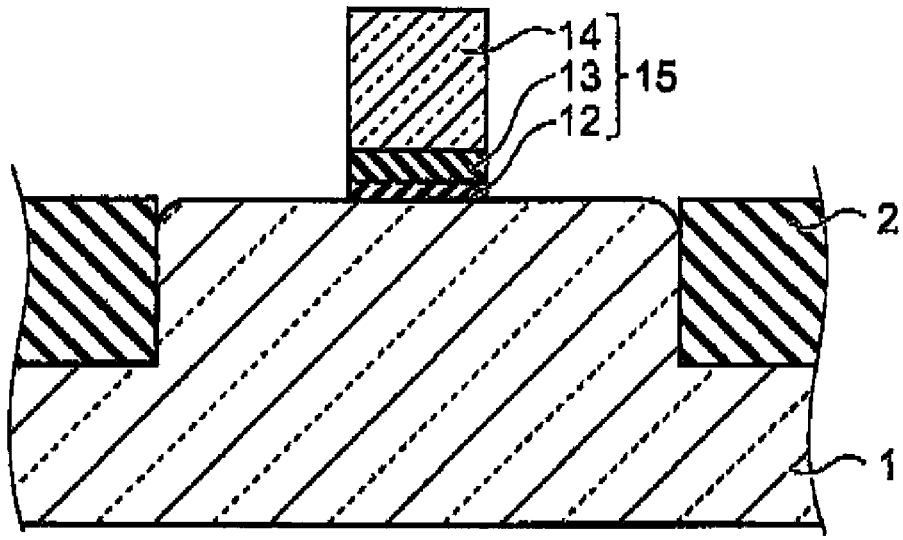

Next, a polysilicon film, and a conductive material film 14A becoming a base of the gate electrode 14 such as TiN, Mo, Au, Al, Pt, Ag, W are formed on the whole surface of the High-K film 13A (FIG. 3F). Thereafter, a resist (not shown) is formed at a position of forming a gate electrode by a photolithography technique on the conductive material film 14A. The conductive material film 14A, the High-K film 13A, and the interface layer 12A are etched using this resist as a mask, thereby forming the gate stacked layer 15 including the interface layer 12, the High-K film 13, and the gate electrode 14 (FIG. 3G).

Figure 3H:
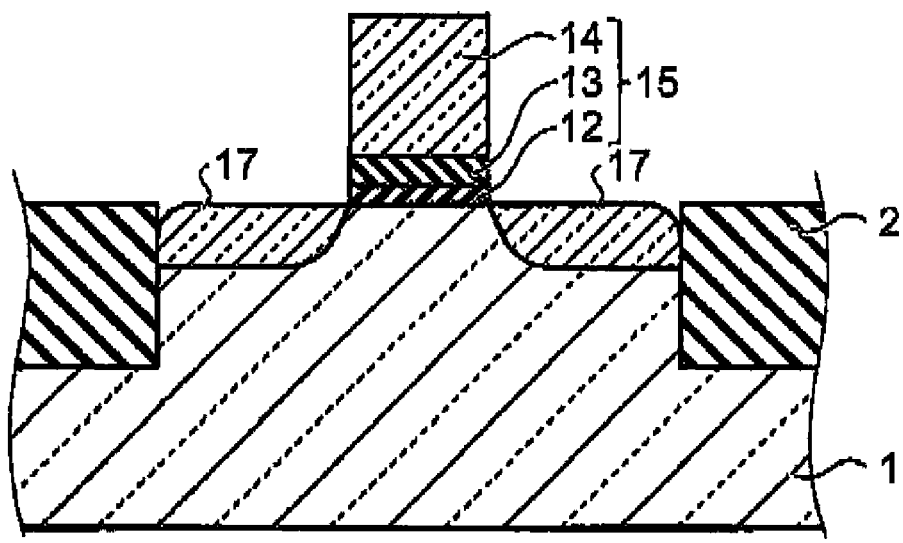

After removing the resist, a predetermined impurity ion is implanted into the surface of the silicon substrate 1 at both sides of the gate stacked layer 15 in a line width direction, using the gate stacked layer 15 as a mask, thereby activating the silicon substrate 1. As a result, the source/drain regions 17 including a second-conductive active layer are formed (FIG. 3H). For example, P and As are ion-implanted as impurities to form the n-type source/drain regions 17, and B and the like are ion-implanted to form the p-type source/drain regions 17.

Thereafter, a dielectric film including a silicon nitride film is formed on the silicon substrate 1 on which the gate stacked layer 15 is formed. Anisotropic etching is performed so that an insulation film remains on only both sides surfaces of the gate stacked layer 15 in a line width direction, thereby forming the gate sidewall film 16 and forming the gate structure 11. As a result, the semiconductor device shown in FIG. 1 is obtained.

Figure 7:
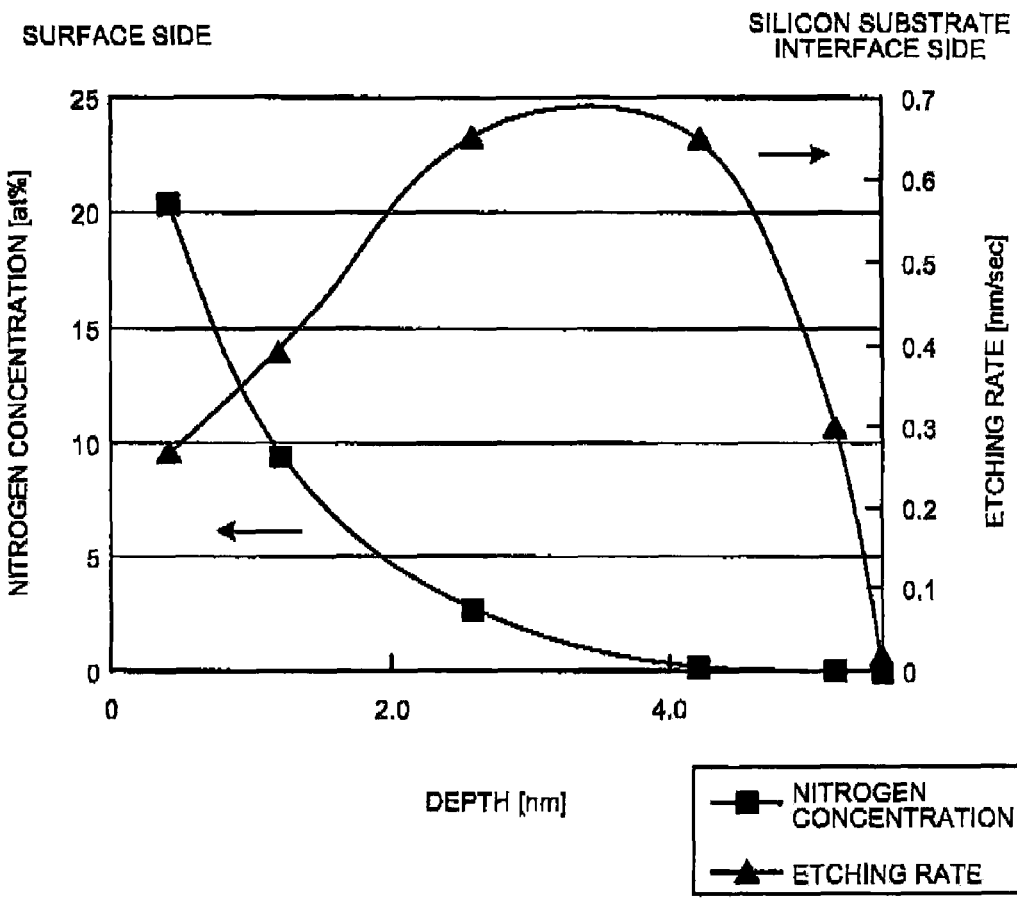
FIG. 7 depicts a relationship between an etching rate and nitrogen concentration in the SiON film formed by the plasma nitridation process.

In the first embodiment, a thermal nitridation process using NO gas, a thermal nitridation process using $NH_3$ gas, and a thermal nitridation process using $N_2ON$ gas are explained as examples of the thermal nitridation process of the $SiO_2$ film becoming a base of the interface layer 12A. A plasma nitridation process is also available as the thermal nitridation process. FIG. 7 depicts a relationship between an etching rate and nitrogen concentration in the SiON film formed by the plasma nitridation process. Specifically, FIG. 7 depicts a relationship between nitrogen concentration in the SiON film formed by the plasma nitridation process and the etching rate when the SiON film is wet etched in the ammonium fluoride solution. In FIG. 7, a horizontal axis represents a depth (nm) from the upper surface of the SiON film, and a vertical axis at the left side represents nitrogen concentration (at %) in the SiON film. A vertical axis at the right side represents an etching rate (nm/sec) of the SiON film. In FIG. 7, data indicated by black squares represents nitrogen concentration, and data indicated by black triangles represents an etching rate. As shown in FIG. 7, the SiON film manufactured by the plasma nitridation process has a peak of nitrogen concentration on the upper surface of the SiON film, and the nitrogen concentration becomes low toward the silicon substrate. That is, nitrogen is not introduced into the SiON film near the interface with the silicon substrate, and the interface includes an $SiO_2$ composition.

Therefore, when etching is performed using the ammonium fluoride solution, which is one of the etching liquids capable of taking a larger selection rate of an $SiO_2$ film than a selection rate of a silicon oxide-nitride film, the etching rate becomes low near the upper surface of the interface layer 12 having nitrogen concentration about 10 at % and including substantially the SiON film, and the etching does not progress so much. However, in the region having nitrogen concentration lower than about 10 at % and substantially including an $SiO_2$ composition, the etching rate increases, and the whole SiON film is finally removed. That is, in the SiON film manufactured by the plasma nitridation process, nitrogen is not introduced into the SiON film near the interface with the silicon substrate 1. Therefore, it is difficult to control the etching so that the interface layer 12A having a thickness within 0.2 nm to 1 nm from the interface with the silicon substrate 1 is left, as explained above. Consequently, it is not realistic to use the plasma nitridation process in the nitridation process of introducing nitrogen into the $SiO_2$ film. As shown in FIG. 7, a portion of the SiON film near the interface with the silicon substrate 1 has low nitrogen concentration and includes an $SiO_2$ composition. Therefore, reoxidation cannot be suppressed, and a film thickness of the interface layer 12A has a possibility of being increased after forming the High-K film 13A.

In forming the gate stacked layer 15 shown in FIG. 3G, corners of the silicon substrate 1 near the upper part of the boundary between the silicon substrate 1 and the element-isolation dielectric film 2 can be rounded as shown in FIG. 3G. However, it is not mandatory that the corners be rounded. When the gate stacked layer 15 shown in FIG. 3G is viewed from a side surface of the gate stacked layer 15 in a line width direction, the gate electrode 14 is overlapped with the corner of the element-isolation dielectric film 2. Therefore, in a situation that the corners of the silicon substrate 1 is not round (the corner is sharp), the electric field between the gate electrode 14 and the silicon substrate 1 concentrates at the corners of the silicon substrate 1, thereby increasing a leak current or degrading reliability. Accordingly, it is preferable to round the corners at the upper part of the silicon substrate 1 at the portion in contact with the element-isolation dielectric film 2.

According to the first embodiment, the SiON film is used having 0.2 nm to 1 nm as a thickness of the interface layer 12A and having a peak of nitrogen concentration within a range of 0.5 nm from the interface with the silicon substrate 1 in the profile of a depth-direction distribution of nitrogen concentration in the interface layer 12A. Therefore, even when the High-K film 13A is formed on the interface layer 12A, a subsequent reoxidation of the interface layer 12A at the interface with the silicon substrate 1 can be suppressed, an increase in the film thickness of the interface layer 12A can be prevented, and downsizing becomes possible. As a result, an actual physical film thickness can be increased, and a gate leak current can be prevented while keeping a small capacitance-conversion film thickness of the gate dielectric film combining the interface layer 12A and the High-K film 13A.

Furthermore, the $SiO_2$ film having a thickness larger than 1 nm is formed on the silicon substrate 1 by heat oxidation. The SiON film 22 is formed by thermal nitridation process so that nitrogen concentration in the range of 0.2 nm to 1 nm from the interface with the silicon substrate 1 becomes equal to or higher than a predetermined value (10 at %). The interface layer 12A is formed by etching in the condition that a selection rate of the $SiO_2$ film becomes higher than a selection rate of the silicon oxygen-nitride film. Therefore, in etching the interface layer 12A, the etching can be stopped automatically when nitrogen concentration reaches a predetermined value.

Particularly, when a thermal nitridation process is performed in the SiON film so that nitrogen concentration has a peak in the range of 0.5 nm from the interface with the silicon substrate 1, a film thickness of the interface layer 12A at which the etching stops automatically can be controlled to 0.2 nm to 1 nm. That is, a film thickness of the SiON film (the interface layer 12A) arranged between the silicon substrate 1 and the High-K film 13A can be decreased to 0.2 nm to 1 nm. Because nitrogen is introduced into the interface layer 12A near the interface with the silicon substrate 1, reoxidation of the interface layer 12A after forming the High-K film 13A can be suppressed, and increase in the film thickness of the interface layer 12A can be also suppressed.

Effects of the first embodiment are explained below in detail. First, in the field-effect transistor formed with the conventional process, it is known that an interface layer (an $SiO_2$ film) of 1.5 nm (physical film thickness=capacitance-conversion film thickness) is formed. On the other hand, in the above example, a film thickness of the interface layer 12 is 0.5 nm. In other words, the manufacturing method according to the first embodiment is advantageous in thinning the physical film thickness of the interface layer 12 by about 1 nm. Because the interface layer 12 according to the first embodiment contains nitrogen in high concentration (30 at %), the dielectric constant of the interface layer 12 is higher than that of the conventional film (an $SiO_2$ film). Therefore, the film thinning effect of the capacitance-conversion film thickness is considered to be larger than the film thinning effect of the physical film thickness. For example, when the interface layer 12 according to the first embodiment has a film thickness of 0.5 nm, contains nitrogen in high concentration, and has a dielectric constant two times larger than that of the $SiO_2$ film, the capacitance-conversion film thickness of the interface layer 12 (the SiON film) becomes about 0.3 nm which is about a half of the physical film thickness. Therefore, when the film thickness of the interface layer 12 is compared in terms of the capacitance-conversion film thickness, the film thickness in the first embodiment is about 0.3 nm as compared with the film thickness (the capacitance-conversion film thickness) 1.5 nm of the interface layer 12 according to the conventional process. Accordingly, the film thinning effect of the capacitance film thickness becomes 1.2 nm which is a difference between both film thicknesses. As explained above, according to the first embodiment, a large film thinning effect can be obtained in the physical film thickness and the capacitance film thickness of the interface layer 12.

In a second embodiment of the present invention, the configuration explained in the first embodiment is applied to a field-effect transistor having plural types of gate dielectric films (hereinafter, "multigate dielectric film") in different thicknesses formed on one silicon substrate.

Figure 8:
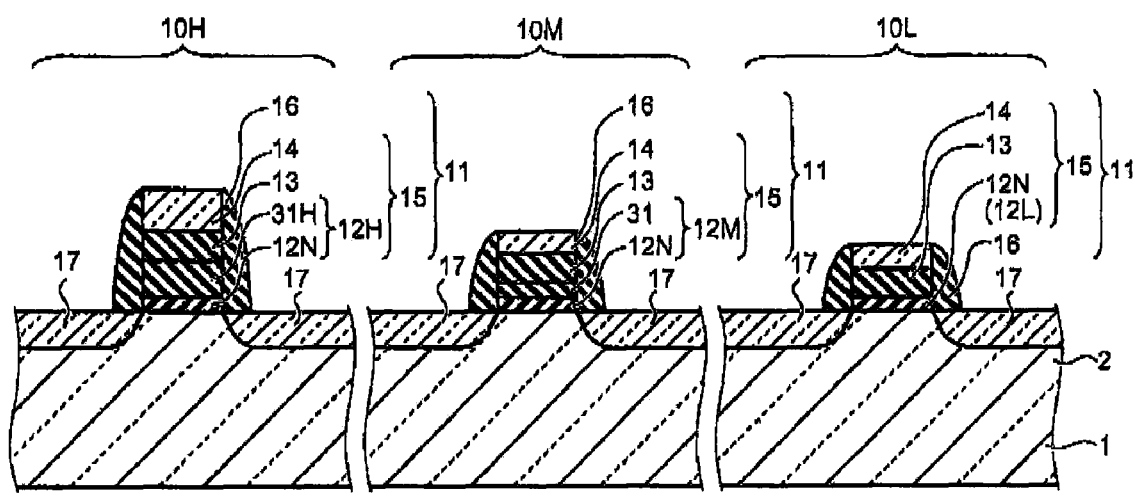
FIG. 8 is a cross-sectional view of an example of a configuration of a semiconductor device according to a second embodiment of the present invention.

FIG. 8 is a cross-sectional view of an example of a configuration of a semiconductor device according to the second embodiment. In this example, three types of field-effect transistors having gate dielectric films of different thicknesses are formed on the same silicon substrate 1. The semiconductor device includes a field-effect transistor 10H having a thickness of an interface layer 12H larger than 3 nm (hereinafter, "thick-film field-effect transistor"), a field-effect transistor 10M having a thickness of an interface layer 12M within a range of 2 nm to 3 nm (hereinafter, "intermediate-film field-effect transistor"), and a field-effect transistor 10L having a thickness of an interface layer 12L within a range of 0.2 nm to 1 nm (hereinafter, "thin-film field-effect transistor").

The interface layer 12H of the thick-film field-effect transistor 100H includes an SiON film 12N having a thickness within a range of 0.2 nm to 1 nm and nitrogen concentration equal to or higher than predetermined concentration (10 at %), and an $SiO_2$ film 31H having a thickness equal to or larger than 2.8 nm and nitrogen concentration lower than the predetermined concentration (10 at %). The interface layer 12M of the intermediate-film field-effect transistor 10M includes the SiON film 12N having a thickness within a range of 0.2 nm to 1 nm and nitrogen concentration equal to or higher than the predetermined concentration (10 at %), and an $SiO_2$ film 31M having a thickness equal to or larger than 1.8 nm and nitrogen concentration lower than the predetermined concentration (10 at %). The interface layer 12L of the thin-film field-effect transistor 10L includes the SiON film 12N having a thickness within a range of 0.2 nm to 1 nm and nitrogen concentration equal to or higher than the predetermined concentration (10 at %). Because other constituent elements of the field-effect transistors 10H, 10M, and 10L are basically the same as those explained in the first embodiment, like reference numerals or letters are denoted to like constituent elements and explanations thereof will be omitted.

A method of manufacturing the field-effect transistor having a multigate dielectric film having a plurality of film thicknesses in this field-effect transistor is explained next. FIG. 9A to FIG. 9F are cross-sectional views for explaining an example of a procedure of manufacturing the field-effect transistor having the multigate dielectric film. In FIG. 5A to FIG. 9F, a region in which the thick-film field-effect transistor 10H is formed on the silicon substrate 1 is called a thick-film formation region $R_H$, a region in which the intermediate-film field-effect transistor 10M is formed is called an intermediate-film formation region $R_M$, and a region in which the thin-film field-effect transistor 10L is formed is called a thin-film formation region $R_L$.

Figure 9A:
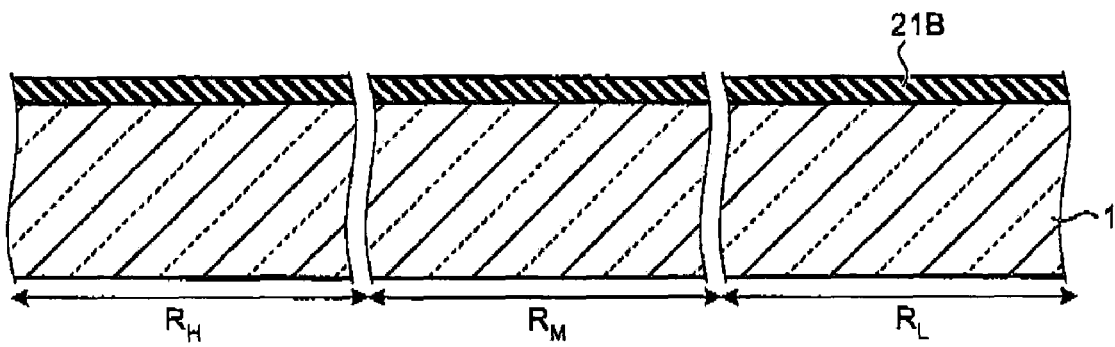
FIG. 9A to FIG. 9F are cross-sectional views for explaining an example of a procedure of manufacturing a field-effect transistor having a multigate dielectric film.

First, an $SiO_2$ film 21B that functions as a base of the interface layer 12 is formed by thermal oxidation on the first-conductive silicon substrate on which an element-isolation dielectric film having a predetermined pattern no shown is formed by the STI method or the like (FIG. 9A). The $SiO_2$ film 21B has a thickness of 3 nm, for example.

Figure 9B:
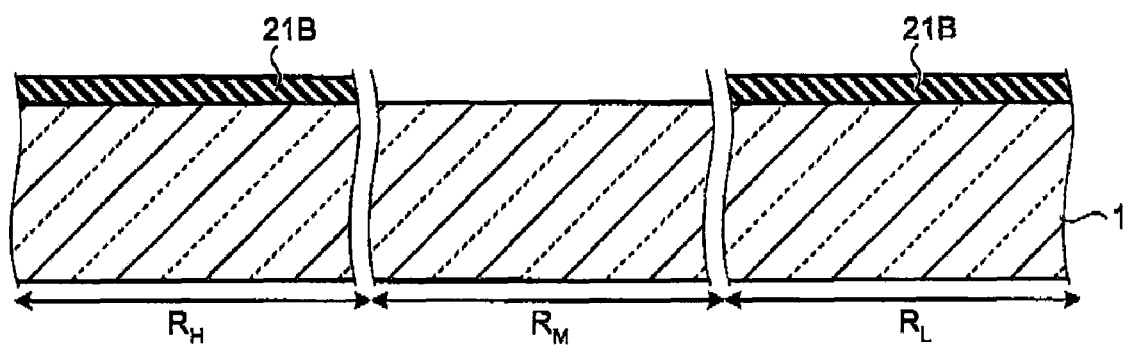

Thereafter, a resist is coated on the whole surface of the $SiO_2$ film 21B. The $SiO_2$ film 2113 is patterned so that an upper surface of the $SiO_2$ film 21B in the intermediate-film formation region $R_M$ is exposed and the $SiO_2$ film 21B in the thick-film formation region $R_H$ and the thin-film formation region $R_L$ is coated, thereby forming a mask (not shown). The $SiO_2$ film 21B in the intermediate-film formation region $R_M$ is etched using this mask (FIG. 9B).

Figure 9C:
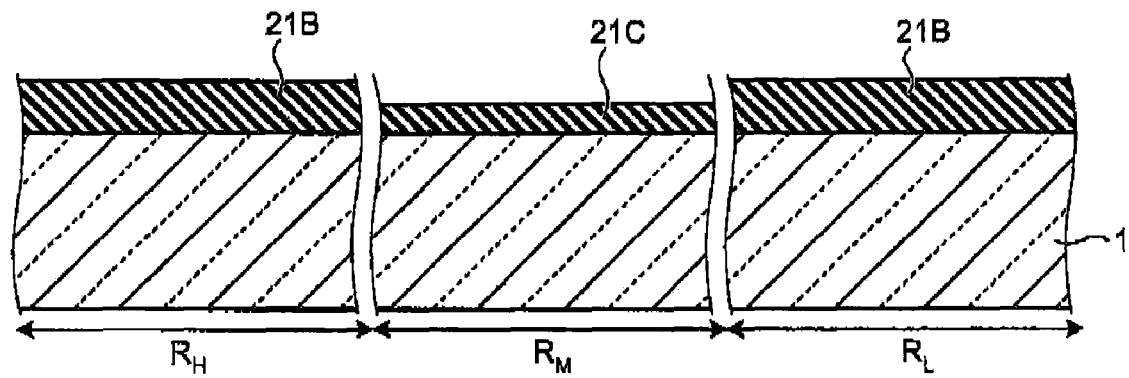

The mask of the thick-film formation region $R_H$ and the thin-film formation region $R_L$ is removed, and thereafter, thermal oxidation is performed again to form $SiO_2$ films 21B and 21C on the surface of the silicon substrate 1 (FIG. 9C). By this thermal oxidation, the $SiO_2$ film 21C is formed on the surface of the silicon substrate 1 in the intermediate-film formation region $R_M$ removed by the preceding process, and a film thickness of the $SiO_2$ film 21B in the thick-film formation region $R_H$ and the thin-film formation region $R_L$ increases. In this example, the $SiO_2$ film 21C having a film thickness of 2 nm is formed in the intermediate-film formation region $R_M$, and a film thickness of the $SiO_2$ film 21B in the thick-film formation region $R_H$ and the thin-film formation region $R_L$ is increased to 3.5 μm.

Figure 9D:
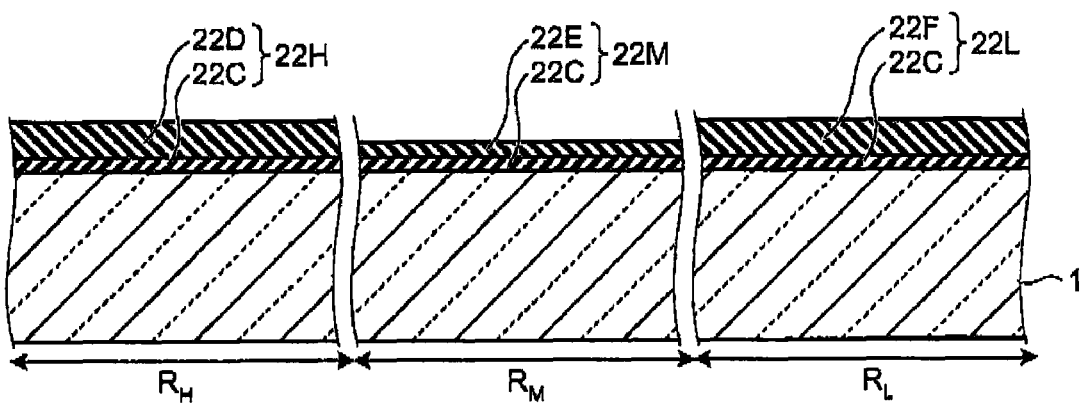

Next, a thermal nitridation process is performed so that nitrogen concentration has a peak in the $SiO_2$ films 21B and 21C near the interface with the silicon substrate 1 (range of 0.5 nm in the $SiO_2$ films 21B and 21C from the interface with the silicon substrate 1) and so that nitrogen concentration becomes predetermined concentration (equal to or above 10 at %) within a range of 0.2 nm to 1 nm in the $SiO_2$ films 21B and 21C from the interface with the silicon substrate 1, thereby forming SiON films 22H, 22M, and 22L from the SiO$_2$ films 21B and 21C (FIG. 9D). In this case, it is preferable that nitrogen concentration is equal to or higher than about 10 at % in the regions of the SiO$_2$ films 21B and 21C at the silicon substrate 1 side, particularly, within a range of 0.2 nm to 1 nm in the SiO$_2$ films 21B and 21C from the interface with the silicon substrate 1. This thermal nitridation process can be performed within a range of temperature 800° C. to 950° C. in the NO gas atmosphere, the NH$_3$ gas atmosphere, and the N$_2$ gas atmosphere. By performing this thermal nitridation process, a film thickness becomes 3.7 nm in the thick-film formation region R$_H$ and the thin-film formation region R$_L$, and a film thickness becomes 2.3 nm in the intermediate-film formation region R$_M$. Regions within a range of 0.2 nm to 1 nm in the SiON films 22H, 22M, and 22L in the regions R$_H$, R$_M$, and R$_L$ respectively from the interface with the silicon substrate 1 are an SiON composition region 22C having high nitrogen concentration. Other regions have low nitrogen concentration, and are near the SiO$_2$ composition, and therefore, become SiO$_2$ composition regions 22D, 22E, and 22F. A thickness and nitrogen concentration in the SiON composition regions formed by this thermal nitridation process change based on a thickness of the original SiO$_2$ film. Specifically, when a thickness of the SiO$_2$ film becomes larger, concentration of nitrogen introduced into the SiO$_2$ film at the interface with the silicon substrate 1 becomes lower, and a thickness of the SiON composition region becomes smaller. For example, in FIG. 9D, a thickness of the SiON composition region 22C in the thick-film formation region R$_H$ and the thin-film formation region R$_L$ becomes smaller than a thickness of the SiON composition region 22C in the intermediate-film formation region R$_M$.

Figure 9E:
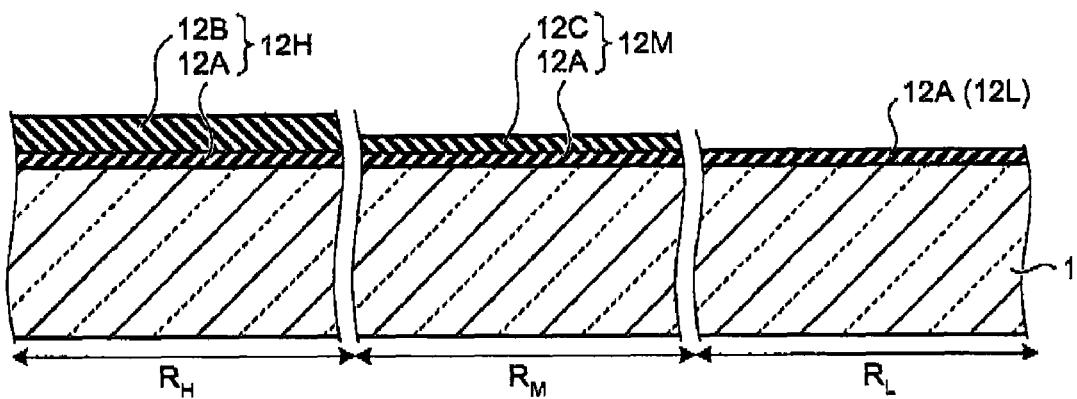

Thereafter, a resist is coated on the whole surface of the SiON films 22H, 22M, and 22L. The SiON films 22H, 22M, and 22L are patterned so that only an upper surface of the SiON film 22L in the thin-film formation region R$_L$ is exposed and the SiON films 22H and 22M in the thick-film formation region R$_H$ and the intermediate-film formation region R$_M$ are coated, thereby forming a mask (not shown). The SiO$_2$ composition region 22F in the thin-film formation region R$_L$ is etched using this mask (FIG. 9E). The etching is performed in a condition that a selection rate of an SiO$_2$ film is larger than that of a silicon oxide-nitride film. An ammonium fluoride solution and a hydrogen fluoride solution can be used for the etching liquid to perform wet etching satisfying this condition.

In this case, the SiON film 22C in the thin-film formation region R$_L$ is thermally nitrogenized to have a thickness within a range of 0.2 nm to 1 μm, nitrogen concentration equal to or higher than the predetermined concentration (10 at %), and a peak of nitrogen concentration within a range of 0.5 nm from the interface with the silicon substrate 1. Therefore, the etching rate becomes small within a range of 0.2 nm to 1 nm from the interface with the silicon substrate 1, and the etching speed becomes slow. That is, when the SiON film 22C has a thickness within a range of 0.2 nm to 1 nm, the etching is substantially suspended, and the etching based on the self-limit function becomes possible.

By this etching, the SiON composition region 22C is left in the SiON film 22C in the thin-film formation region R$_L$, and the interface layer 12L including an SiON film 12A is formed. The SiON film 22H remains as it is in the thick-film formation region R$_H$. The SiON film 22H is hereinafter called the interface layer 12H including the SiON film 12A and the SiO$_2$ film 12B. The SiON film 22M also remains as it is in the intermediate-film formation region R$_M$. The SiON film 22M is hereinafter called the interface layer 12M including the SiON film 12A and the SiO$_2$ film 12C.

Figure 9F:
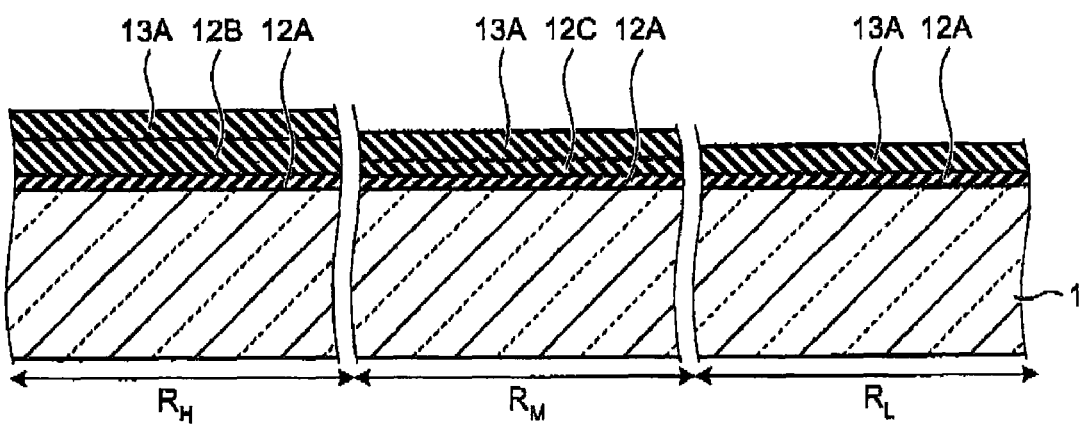

The mask on the thick-film formation region R$_H$ and the intermediate-film formation region R$_M$ are removed. Thereafter, the High-K film 13A such as an HfSiON film having a predetermined thickness is formed on the whole surface of the interface layers 12H, 12M, and 12L in the regions R$_H$, R$_M$, and R$_L$ (FIG. 9F). Specifically, the High-K film 13A is formed on the SiO$_2$ films 12B and 12C in the thick-film formation region R$_H$ and the intermediate-film formation region R$_M$. The High-K film 13A is formed on the SiON film 12A in the thin-film formation region R$_L$. A thickness of the High-K film 13A is determined based on a characteristic and a size of the thin-film field-effect transistor 10L to be manufactured, and concentration and a thickness of the SiON film 12A constituting the interface layer. In this example, the High-K film 13A is deposited by about 3 nm. The High-K film 13A can be arranged to be formed in only the thin-film formation region R$_L$, without removing the mask of the thick-film formation region R$_H$ and the intermediate-film formation region N.

The process explained with reference to FIG. 3F and the following processes in the first embodiment are performed in the regions R$_H$, R$_M$, and R$_L$ on the silicon substrate 1. That is, a polysilicon film and a conductive material film becoming a base of the gate electrode 14 such as TiN, Mo, Au, Al, Pt, Ag, and W are formed on the whole surface of the High-K film 13A. Thereafter, the conductive material film, the High-K film 13A, and the interface layers 12H, 12M, and 12L are etched in a predetermined shape. These films include the SiON film 12A and the SiO$_2$ film 12B in the thick-film formation region R$_H$, include the SiON film 12A and the SiO$_2$ film 12C in the intermediate-film formation region R$_M$, and include the SiON film 12A in the thin-film formation region R$_L$. After etching these films, the gate stacked layer 15 is formed including the interface layers 12H, 12M, and 12L, the High-K film 13, and the gate electrode 14. Thereafter, a predetermined impurity ion is ion-implanted into the surface of the silicon substrate at both sides of the gate stacked layer 15 in a line width direction using the formed gate stacked layer 15 as a mask, thereby forming the source/drain regions 17 including the second-conductive active layer. An insulation film including a silicon nitride film is formed on the silicon substrate 1 on which the gate stacked layer 15 is formed. Anisotropic etching is performed so that the insulation film remains on only both side surfaces of the gate stacked layer 15 in a line width direction, thereby forming the gate sidewall film 16 and forming the gate structure 11. As a result, the semiconductor device shown in FIG. 8 having the field-effect transistors 10H, 10M, and 10L formed in the regions R$_H$, R$_M$, and R$_L$ is obtained.

Figure 10A:
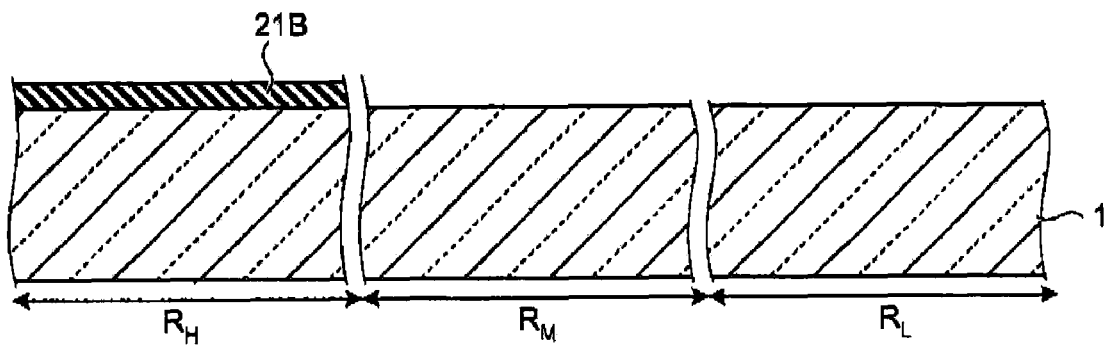
FIG. 10A to FIG. 10C are cross-sectional views for explaining another example of a procedure of manufacturing a field-effect transistor having a multigate dielectric film.
Figure 10B:
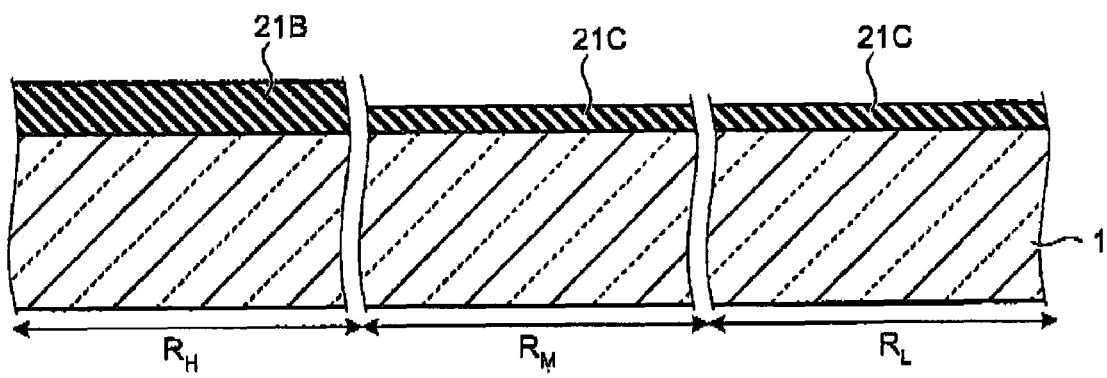
Figure 10C:
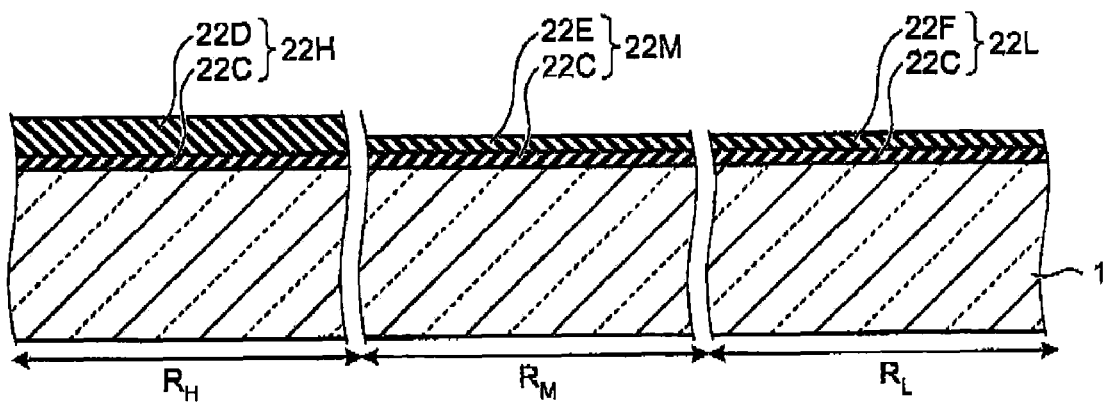

The above is an explanation of one example of the method of manufacturing a semiconductor device. It is needless to say that the semiconductor device can be manufactured by some other procedure. FIG. 10A to FIG. 10C are cross-sectional views schematically depicting another example of a procedure of a method of manufacturing a field-effect transistor having a multigate dielectric film. First, the SiO$_2$ film 21B is formed by heat oxidizing the surface of the silicon substrate 1 as shown in FIG. 9A.

Next, a resist is coated on the whole surface of the SiO$_2$ film 21B to pattern so that only the thick-film formation region R$_H$ is covered, thereby forming a mask (not shown). The SiO$_2$ film 21B in the intermediate-film formation region R$_M$ and the thin-film formation region R$_L$ is removed using this mask (FIG. 10A). The mask on the thick-film formation region R$_H$ is removed. Thereafter, the silicon substrate 1 is heat oxidized to form the SiO₂ film 21C having a smaller thickness than that of the SiO₂ film in the intermediate-film formation region $R_M$ and the thin-film formation region $R_L$ (FIG. 10B) In this case, a film thickness of the SiO₂ film 21B in the thick-film formation region $R_H$ is increased.

Thereafter, a thermal nitridation is performed so that nitrogen concentration has a peak in the SiO₂ films 21B and 21C near the interface with the silicon substrate 1 and so that nitrogen concentration becomes equal to or higher than 10 at % in the SiO₂ films 21B and 21C within a range of 0.2 nm to 1 nm from the interface with the silicon substrate 1, thereby forming the SiON films 22H, 22M, and 22L from the SiO₂ films 21B and 21C (FIG. 10C). In this case, nitrogen concentration is preferably equal to or higher than about 10 at % in a region of the SiO₂ films 21B and 21C at the silicon substrate 1 side, particularly in the SiO₂ films 21B and 21C in a range of 0.2 nm to 1 nm from the interface with the silicon substrate 1. For this thermal nitridation process, heat processing at a temperature within 800° C. to 950° C. in NO gas atmosphere, NH₃ gas atmosphere, or N₂O gas atmosphere can be exemplified. By performing this thermal nitridation process, a film thickness becomes 3.7 nm in the thick-film formation region $R_H$, and a film thickness becomes 2.3 nm in the intermediate-film formation region $R_M$ and the thin-film formation region $R_L$. Regions in the SiON films 22H, 22M, and 22L in the regions $R_H$, $R_M$, and $R_L$ within a range of 0.2 nm to 1 nm from the interface with the silicon substrate 1 are the SiON composition region 22C having high nitrogen concentration. Other regions have low nitrogen concentration, and are near the SiO₂ composition, and therefore, become the SiO₂ composition regions 22D, 22E, and 22P.

Thereafter, the process explained with reference to FIG. 9E and following processes are performed. The field-effect transistors 10H, 10M, and 10L having mutually different thicknesses of the interface layers 12H, 12M, and 12L in the regions $R_H$, $R_M$, and $R_L$, respectively are formed. According to the manufacturing procedure, a thickness of the SiO₂ film 21C in the thin-film formation region $R_L$ thermally nitrogenized becomes smaller than that in the example explained with reference to FIG. 9A to FIG. 9F. Therefore, nitrogen can be introduced efficiently into the SiO₂ film 21C at the interface with the silicon substrate 1.

Effects of the second embodiment are explained below. In the conventional process of forming an insulation film having three types of different thicknesses as described above, the following three processes need to be performed: a process that after forming the SiO₂ film 21C in the intermediate-film formation region $R_M$ shown in FIG. 9C, the SiO₂ film 21B in the thin-film formation region $R_L$ is removed without performing the thermal nitridation process; a process that an SiO₂ film having a predetermined film thickness is formed in the thin-film formation region $R_L$ by performing the heat oxidation process; and a process that an interface layer is formed by nitrogenizing the SiO₂ film in the thin-film formation region $R_L$. On the other hand, in the second embodiment, in forming the interface layer 12L in the thin-film formation region $R_L$, the SiO₂ film 21B formed in common in all regions at the beginning or the SiO₂ film 21C formed simultaneously with the intermediate-film formation region $R_M$ is thermally nitrogenized, thereby forming the SiON film 22L. The SiO₂ composition region 22F at an upper part of the SiON film 22L is then etched. Therefore, the number of steps can be decreased from that of the conventional process.

Further, in forming the interface layer 12L in the thin-film formation region $R_L$, when the SiO₂ film 213 formed by heat oxidizing the whole surface of the silicon substrate 1 at the beginning is thermally nitrogenized, a step of removing the SiO₂ film 21B in the thin-film formation region $R_L$ is not involved. Therefore, the interface between the silicon substrate 1 and the interface layer 12 does not become rough.

On the other hand, as shown in FIG. 10A to FIG. 10C, in forming the SiO₂ film 21C in the intermediate-film formation region $R_M$, when the SiO₂ film 21B first formed in the intermediate-film formation region $R_M$ and in the thin-film formation region $R_L$ is removed and also when the SiO₂ film 21C formed again by heat oxidation is thermally nitrogenized, the interface between the silicon substrate 1 and the interface layer 12 becomes rougher than in the above case. However, because a thickness of the SiO₂ film 21C is smaller than that of the SiO₂ film 21B first formed, high-concentration nitrogen can be introduced into the interface layer 12 at the silicon substrate 1 side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device including a gate electrode formed on a silicon substrate via a high-dielectric-constant material film having a higher dielectric constant than that of silicon oxide, and a source/drain region formed on a surface of the silicon substrate around the gate electrode, the method comprising:
    forming a silicon oxide film on the silicon substrate;
    nitrogenizing the silicon oxide film to form a silicon oxide-nitride film so that nitrogen having concentration equal to or higher than a predetermined concentration is introduced into the silicon oxide film within a range of a thickness from 0.2 nanometer to 1 nanometer from an interface with the silicon substrate, so that a peak of a depth-direction distribution of nitrogen concentration in the silicon oxide film is within 0.5 nanometer from the interface with the silicon substrate, and nitrogen concentration in the silicon oxide film is lowered from the interface with the silicon substrate toward the high-dielectric-constant material film, within the range of thickness;
    etching the silicon oxide-nitride film to a thickness to which the nitrogen in the predetermined concentration or more is introduced thereby forming an interface layer including a silicon oxide-nitride film introduced with nitrogen in the predetermined concentration or higher; and
    forming the high-dielectric-constant material film on the interface layer.

2. The method according to claim 1, wherein the nitrogenizing includes introducing nitrogen having concentration equal to or higher than 10 at % into the silicon oxide film at an interface with the high-dielectric-constant material film.

3. The method according to claim 2, wherein the nitrogenizing includes introducing nitrogen having concentration equal to or higher than 20 at % into the silicon oxide film at an interface with the high-dielectric-constant material film.

4. The method according to claim 2, wherein the nitrogenizing includes heat nitridizing the silicon oxide film in an atmosphere containing any one of NO gas, NH₃ gas, and N₂O gas.

5. The method according to claim 4, wherein the nitrogenizing is performed at a temperature from 800° C. to 950° C.

6. The method according to claim 2, wherein the etching includes performing etching using etching liquid or etching gas capable of taking a larger selection rate of a silicon oxide film than that of a silicon oxide-nitride film.

7. The method according to claim 6, wherein the etching liquid is any one of ammonium fluoride solution and hydrogen fluoride solution.

8. A method of manufacturing a semiconductor device including on a silicon substrate a plurality of types of field-effect transistors having different capacitance film-thicknesses of a gate dielectric film, each field-effect transistor including the gate dielectric film and a gate electrode formed on the silicon substrate, and a source/drain region formed on a surface of the silicon substrate around the gate electrode, the method comprising:
forming a silicon oxide film in a first region and a second region on the silicon substrate;
nitrogenizing the silicon oxide film to form a silicon oxide-nitride film so that nitrogen having concentration equal to or higher than a predetermined concentration is introduced into the silicon oxide film within a range of a thickness from 0.2 nanometer to 1 nanometer from an interface with the silicon substrate, so that a peak of a depth-direction distribution of nitrogen concentration in the silicon oxide film is within 0.5 nanometer from the interface with the silicon substrate, and nitrogen concentration in the silicon oxide film is lowered from the interface with the silicon substrate toward a surface thereof, within this range of thickness;
etching the silicon oxide-nitride film to a thickness to which the nitrogen in the predetermined concentration or more is introduced thereby forming on the first region an interface layer including a silicon oxide-nitride film introduced with nitrogen in the predetermined concentration or higher; and
forming a high-dielectric-constant material film having a higher dielectric constant than that of silicon oxide on at least the interface layer in the first region.

9. The method according to claim 8, further comprising:
removing, after forming the silicon oxide film, the silicon oxide film on the second region; and
heat oxidizing the silicon substrate thereby forming a silicon oxide film of a first thickness in the first region; and forming a silicon oxide film of a second thickness thinner than the first thickness in the second region.

10. The method according to claim 8, wherein the nitrogenizing includes introducing nitrogen having concentration equal to or higher than 10 at % into the silicon oxide film at an interface with the high-dielectric-constant material film.

11. The method according to claim 10, wherein the nitrogenizing includes introducing nitrogen having concentration equal to or higher than 20 at % into the silicon oxide film at an interface with the high-dielectric-constant material film.

12. The method according to claim 10, wherein the nitrogenizing includes heat nitridizing the silicon oxide film in an atmosphere containing any one of NO gas, $NH_3$ gas, and $N_2O$ gas.

13. The method according to claim 12, wherein the nitrogenizing is performed at a temperature from 800° C. to 950° C.

14. The method according to claim 10, wherein the etching includes performing etching using etching liquid or etching gas capable of taking a larger selection rate of a silicon oxide film than that of a silicon oxide-nitride film.

15. The method according to claim 14, wherein the etching liquid is anyone of ammonium fluoride solution and hydrogen fluoride solution.

16. A method of manufacturing a semiconductor device including a gate electrode formed on a silicon substrate via a high-dielectric-constant material film having a higher dielectric constant than that of silicon oxide, and a source/drain region formed on a surface of the silicon substrate around the gate electrode, the method comprising:
forming a silicon oxide film on the silicon substrate;
nitrogenizing the silicon oxide film to form a silicon oxide-nitride film so that nitrogen having concentration equal to or higher than a predetermined concentration is introduced into the silicon oxide film within a range of a thickness from 0.2 nanometer to 1 nanometer from an interface with the silicon substrate, and so that nitrogen concentration in the silicon oxide film is lowered from the interface with the silicon substrate toward the high-dielectric-constant material film, within the range of thickness;
etching the silicon oxide-nitride film to a thickness to which the nitrogen in the predetermined concentration or more is introduced thereby forming an interface layer including a silicon oxide-nitride film introduced with nitrogen in the predetermined concentration or higher; and
forming the high-dielectric-constant material film on the interface layer,
wherein the nitrogenizing includes introducing nitrogen having concentration equal to or higher than 20 at % into the silicon oxide film at an interface with the high-dielectric-constant material film.

17. The method according to claim 16, wherein the nitrogenizing includes heat nitridizing the silicon oxide film in an atmosphere containing any one of NO gas, $NH_3$ gas, and $N_2O$ gas.

18. The method according to claim 17, wherein the nitrogenizing is performed at a temperature from 800° C. to 950° C.

19. The method according to claim 16, wherein the etching includes performing etching using etching liquid or etching gas capable of taking a larger selection rate of a silicon oxide film than that of a silicon oxide-nitride film.

20. The method according to claim 19, wherein the etching liquid is any one of ammonium fluoride solution and hydrogen fluoride solution.

* * * * *